(12) United States Patent
Kropfitsch et al.

(10) Patent No.: US 9,455,671 B2
(45) Date of Patent: *Sep. 27, 2016

(54) SYSTEM AND METHOD FOR CAPACITIVE SIGNAL SOURCE AMPLIFIER

(71) Applicant: Infineon Technologies AG, Neubiberg (DE)

(72) Inventors: Michael Kropfitsch, Koettmannsdorf (AT); Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/738,353

(22) Filed: Jun. 12, 2015

(65) Prior Publication Data

US 2015/0311870 A1    Oct. 29, 2015

Related U.S. Application Data

(63) Continuation of application No. 13/665,117, filed on Oct. 31, 2012, now Pat. No. 9,083,286.

(51) Int. Cl.
*H03F 1/08* (2006.01)
*H03F 3/187* (2006.01)
*H03F 3/45* (2006.01)
(Continued)

(52) U.S. Cl.
CPC .............. *H03F 1/083* (2013.01); *H03F 1/086* (2013.01); *H03F 3/183* (2013.01); *H03F 3/187* (2013.01); *H03F 3/45475* (2013.01); *H03F 2200/03* (2013.01); *H03F 2200/129* (2013.01); *H04R 3/00* (2013.01); *H04R 19/04* (2013.01)

(58) Field of Classification Search
USPC .................. 330/253, 260; 381/120
See application file for complete search history.

(56) References Cited

U.S. PATENT DOCUMENTS

| 5,399,989 | A | 3/1995 | Chern |
| 6,285,256 | B1 * | 9/2001 | Wong ................ H03F 3/3028 |
| | | | 330/255 |

(Continued)

FOREIGN PATENT DOCUMENTS

WO     2009135815 A1    11/2009

OTHER PUBLICATIONS

Delbruek, T. et al., "Analog VLSI Adaptive, Logarithmic, Wide-Dynamic-Range Photoreceptor," ISCAS, 1994 IEEE International Symposium on Circuits and Systems, vol. 4, Jan. 1994, pp. 339-342.

(Continued)

*Primary Examiner* — Duc Nguyen
*Assistant Examiner* — Yogeshkumar Patel
(74) *Attorney, Agent, or Firm* — Slater Matsil, LLP

(57) ABSTRACT

In accordance with an embodiment, a system for amplifying a signal provided by a capacitive signal source includes a first voltage follower device, a second voltage follower device, and a first capacitor. The first voltage follower device includes an input terminal configured to be coupled to a first terminal of the capacitive signal source, and the second voltage follower device includes an input terminal coupled to the first output terminal of the first voltage follower device, and an output terminal coupled to a second output terminal of the first voltage follower device. Furthermore, first capacitor has a first end coupled to a first output terminal of the first voltage follower device, and a second end configured to be coupled to a second terminal of the capacitive signal source.

23 Claims, 5 Drawing Sheets

(51) Int. Cl.
*H03F 3/183* (2006.01)
*H04R 3/00* (2006.01)
*H04R 19/04* (2006.01)

(56) References Cited

U.S. PATENT DOCUMENTS

| | | |
|---|---|---|
| 8,004,350 B2 | 8/2011 | Draxelmayr |
| 8,067,958 B2 | 11/2011 | Draxelmayr |
| 2003/0155966 A1 | 8/2003 | Harrison |
| 2006/0083392 A1 | 4/2006 | Akino |
| 2011/0142261 A1 | 6/2011 | Josefsson |
| 2011/0150243 A1 | 6/2011 | Onishi |
| 2013/0015919 A1* | 1/2013 | Kropfitsch ............... H03F 1/56 330/260 |

OTHER PUBLICATIONS

Feng, P., et al., "History of the High-Voltage Charge Pump," Book Excerpt, Chapter 1, Professional Engineering 6×9, Charge Pump Circuit Design, Nov. 2006, pp. 1-9.

Harrison, R., et al., "A Low-Power Low-Noise CMOS Amplifier for Neural Recording Applications," IEEE Journal of Solid-State Circuits, vol. 38, No. 6., Jun. 2003, pp. 958-965.

Harrison, R., "Integrated Circuits for Neural Interfacing," Circuits for Emerging Technologies, Feb. 15, 2008, pp. 1-12.

Vittoz, E., et al., "CMOS Analog Integrated Circuits Based on Weak Inversion Operation," IEEE Journal of Solid-State Circuits, Jun. 1977, pp. 224-231.

* cited by examiner

SYSTEM AND METHOD FOR CAPACITIVE SIGNAL SOURCE AMPLIFIER

This is a continuation application of U.S. application Ser. No. 13/665,117, entitled "System and Method for Capacitive Source Amplifier," filed on Oct. 31, 2012, which application is hereby incorporated herein by reference in its entirety.

TECHNICAL FIELD

This invention relates generally to semiconductor circuits and methods, and more particularly to an amplifier for a capacitive signal source.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. The output of the front-end amplifier can be coupled to further analog circuitry or to an A/D converter for digital processing. Because an ECM microphone is made out of discrete parts, the manufacturing process involves multiple steps within a complex manufacturing process. Consequently, a high yielding, low-cost ECM microphone that produces a high level of sound quality is difficult to achieve.

In a microelectro-mechanical Systems (MEMS) microphone, a pressure sensitive diaphragm is etched directly onto an integrated circuit. As such, the microphone is contained on a single integrated circuit rather than being fabricated from individual discrete parts. The monolithic nature of the MEMS microphone produces a higher yielding, lower cost microphone.

The interfacing of a MEMS microphone or sensor with an electrical system, however, poses a number of difficulties because of the microphone's very high output impedance. For example, loading by the preamplifier can potentially attenuate the microphone's output signal, and the high resistance nature of the MEMS microphone makes it prone to EMI disturbance and power supply disturbances due to a poor power supply rejection ratio (PSRR).

SUMMARY OF THE INVENTION

In accordance with an embodiment, a system for amplifying a signal provided by a capacitive signal source includes a first voltage follower device, a second voltage follower device, and a first capacitor. The first voltage follower device includes an input terminal configured to be coupled to a first terminal of the capacitive signal source, and the second voltage follower device includes an input terminal coupled to the first output terminal of the first voltage follower device, and an output terminal coupled to a second output terminal of the first voltage follower device. Furthermore, first capacitor has a first end coupled to a first output terminal of the first voltage follower device, and a second end configured to be coupled to a second terminal of the capacitive signal source.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an amplifier for a capacitive signal source such as a MEMS or an electret condenser microphone (ECM). The invention may also be applied, however, to other types of circuits and systems, such as audio systems, communication systems, sensor systems and other systems that interface to high impedance signal sources.

In an embodiment, an amplifier for a MEMS microphone has a first stage that includes a capacitively coupled gain boosted source follower stage. This first stage provides a high-impedance interface to the MEMS device and a lowered output impedance at an output of the source follower stage. By using a very high resistance biasing network, an amplifier having a bandwidth that spans from a few mHz to tens of KHz and above can be achieved, thereby making embodiments suitable for low frequency sensor and audio applications.

In addition, attenuation due to capacitive loading of parasitic gate-drain capacitance of the source follower stage is reduced by buffering an output signal of the source follower to the drain of the source follower. By applying a buffered signal in-phase output signal to the drain of the gain boosted source follower stage, the parasitic gate-drain capacitance of the gain boosted source follower stage may be reduced. By reducing this gate-drain capacitance, the size of the source follower transistor may be increased to allow for better flicker noise performance without appreciably attenuating the output of the MEMS microphone by the gate-drain capacitance of the source follower transistor.

It should be appreciated that while some of the described embodiments are directed toward MEMS microphone systems, embodiments of the present invention can also be directed toward MEMS sensors, capacitive sensors, and other capacitive and high impedance signal sources.

Figure 1A:
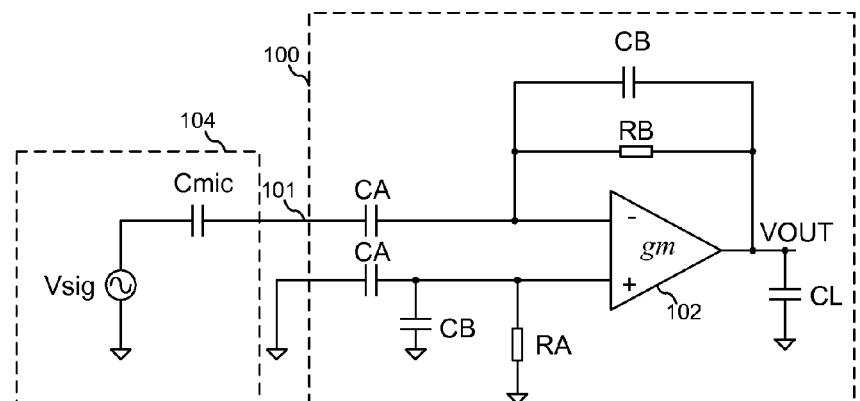
FIGS. 1a-c illustrate capacitive signal source amplifiers according to the prior art.

FIG. 1a illustrates capacitive sensor amplifier 100 according to the prior art that interfaces with capacitive source 104. Capacitive sensor amplifier 100 includes transconductance amplifier 102 having positive and negative input ports coupled to ground and the capacitive signal source 104, respectively via capacitors CA. Capacitor CB is coupled in parallel with resistor RB between the output and the negative input port of amplifier 102, and capacitor CL represents the capacitive loading of amplifier 102. Capacitive source 104, which can be a MEMS microphone, an ECM microphone, or other type of capacitive signal source, is represented by voltage source Vsig coupled in series with capacitor Cmic, which typically has a capacitance between about 1 pF and about 10 pF. The in-band closed loop gain of amplifier 100 is about Am=CA/CB. The transfer characteristic of amplifier 100 has a lower corner frequency at about $1/(2*pi*CB*RB)$ and an upper corner frequency at about $Gm/(2*pi*CL*Am)$. The value of capacitance CA is generally much smaller then sensor capacitance Cmic to minimize signal attenuation.

The noise of amplifier 100 is dominated by the noise of resistors RA and RB at low frequencies, and by the noise of transconductance amplifier 102, which includes flicker noise prevalent at lower frequencies and thermal noise prevalent at higher frequencies. At higher frequencies, the output thermal noise of the amplifier 100 is about $Vnia*(CA+CB)/CB$, where Vnia is the input referred noise of transconductance amplifier 102. It can be seen that large values of CB yield a better noise performance. However, the value of CB is practically limited because CA needs to be large enough in relation to CB to achieve a high voltage gain, but cannot be too large in order to avoid attenuating the input signal 101 due to capacitance division between Cmic and CA.

Figure 1B:
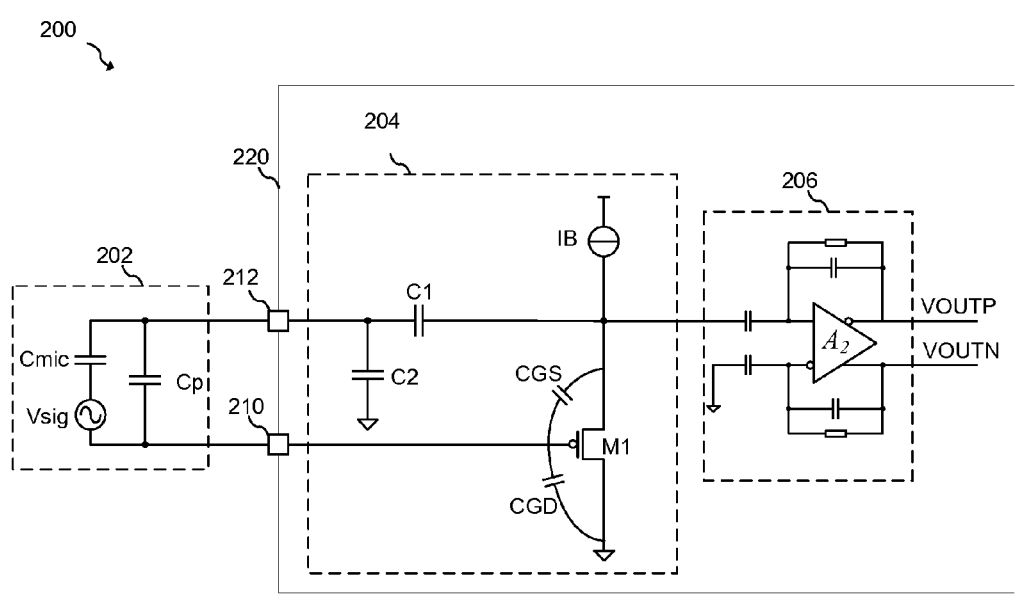

FIG. 1b illustrates amplification system 200 in which capacitive signal source 202 is interfaced with amplifier integrated circuit 220. This system is disclosed in co-pending U.S. patent application Ser. No. 13/183,193 filed on Jul. 14, 2011, entitled, "System and Method for Capacitive Signal Source Amplifier," which application is incorporated by reference herein in its entirety. As shown, amplification system 200 uses gain boosted source follower stage 204 to act as a buffer between capacitive signal source 202 and single-ended to differential converter 206. Compared to amplifier 100, gain boosted source follower stage 204 has a high input impedance and a low output impedance, which reduces the load seen by capacitive sensor 202, generates a higher signal level to drive the input capacitance of single-ended to differential converter 206, and experiences less front-end signal attenuation. As such, better noise performance may be achieved. Noise performance is further enhanced when the gain of stage 204 is configured to have a voltage gain greater than one.

Capacitive signal source 202, which will also be referred to as a "MEMS microphone," is shown having an electrical model of a MEMS microphone that includes a modeled voltage generator Vsig, series microphone capacitance Cmic, and parasitic capacitance Cp. One terminal of MEMS microphone 202 is coupled to the gate of source follower transistor M1, and the other terminal is coupled to capacitors C1 and C2. The combination of source follower transistor M1 and capacitors C1 and C2 form a gain boosted source follower circuit. Because there is minimal phase shift between the gate of transistor M1 and the source of transistor M1, transistor M1 has a gain boosting effect on voltage Vsig. The gain of stage 204 with respect to Vsig is about $G1=1+C1/C2$ neglecting the effect of Cmic, parasitic capacitance Cp, the transconductance of M1, and other parasitic components.

When the effect of other parasitic components, especially gate-drain capacitance CGD of transistor M1 is taken into account, however, the voltage gain of amplification system 200 is reduced with respect to ideal signal gain G1. Here, capacitance CGD acts as a capacitive voltage divider between Cmic and the gate of M1. This attenuation caused by CGD is affected by the width of M1, with larger widths causing higher levels of attenuation. In some cases, this attenuation may be managed by using smaller and narrower devices for M1. However, such smaller devices may produce high levels of flicker noise that may adversely affect system performance in audio systems. Since the level of flicker noise is inversely proportional to the gate area of transistor M1, such noise levels may be lowered by using a larger and wider device size for M1, at the penalty of higher front-end attenuation. As such, the sizing of M1 involves a tradeoff between noise (flicker and thermal) and signal attenuation.

Figure 1C:
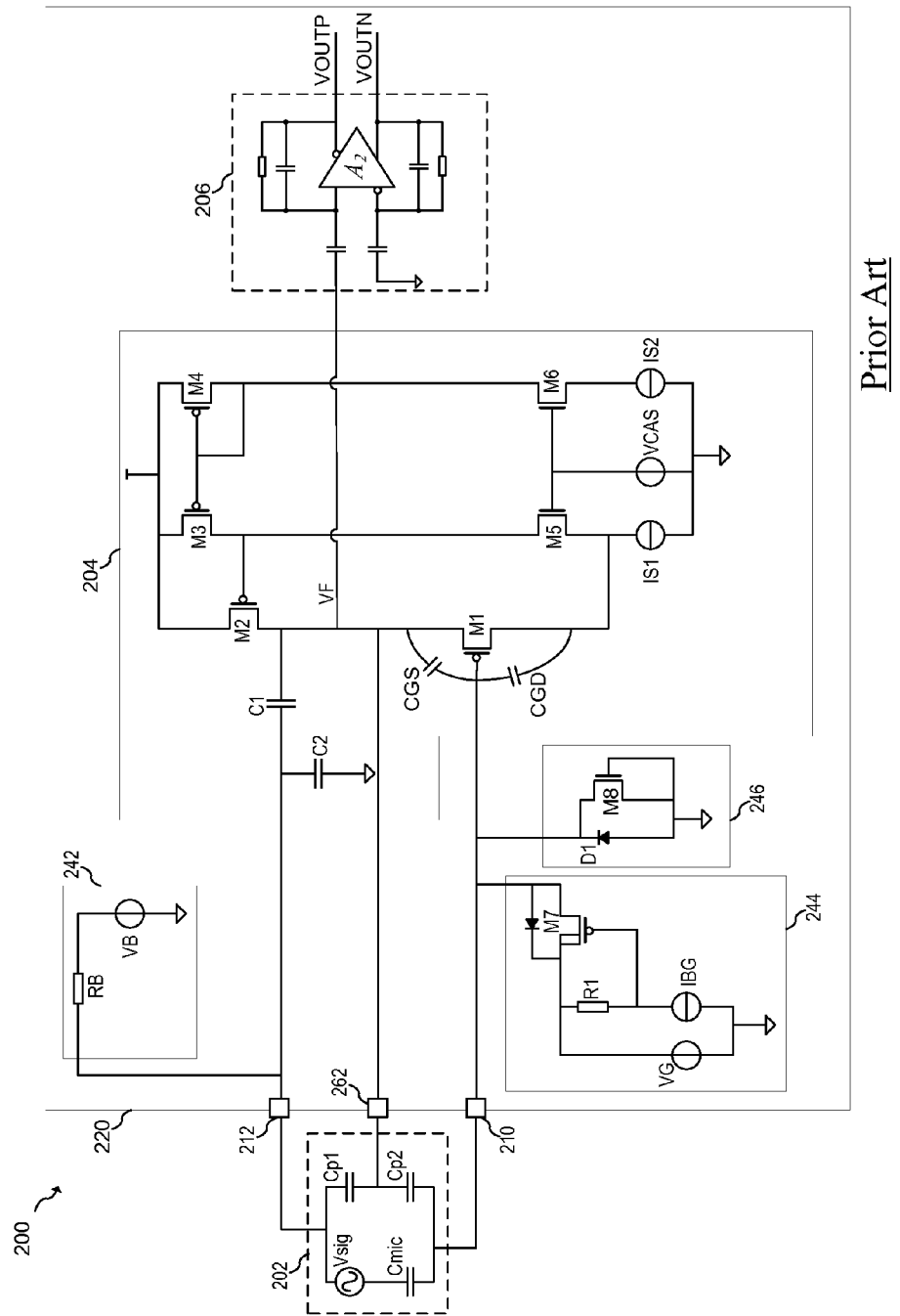

FIG. 1c illustrates a more detailed circuit implementation of system 200 that further includes MEMS microphone bias generator 242, gate bias generator 244, and shock recovery circuit 246 in addition to a more detailed diagram of stage 204.

MEMS microphone bias generator 242 is used to provide a bias voltage to MEMS microphone 202, and is shown modeled by voltage source VB in series with resistance RB, which has a resistance in the GΩ region. Resistance RB and capacitor C2 form a lowpass filter that filters noise coming from voltage source VB. Voltage source VB may be implemented using a charge pump as described in U.S. patent application Ser. No. 13/183,193.

In gain boosted source follower stage 204, source follower transistor M1 is biased using a feedback circuit. The gate of PMOS device M2 is coupled to a high impedance node coupled to the drains of PMOS device M3 and NMOS cascode device M5. PMOS device M2 may also be used to provide source current to M1. The gate of M2 is adjusted such that the sum of the currents though source follower transistor M1 and NMOS cascode device M5 is the current of current source IS1. If, for example, the current though M1 is not sufficient to form IS1 when summed with the current of M5, the gate of M2 is pulled low until the sum of the currents of M1 and M5 once again become IS1. PMOS devices M3 and M4 mirror current IS2 to NMOS device M5, and voltage source VCAS provides a cascode bias voltage for the gates of M5 and M6. The drain of M1 is kept at a low impedance, which may about the source impedance of NMOS M5 divided by the loop gain of the bias generator. Hence, the drain of M1 is effectively coupled to a reference voltage. Because of this, parasitic gate-drain capacitance CGD is applied to the gate of source follower transistor M1.

As shown in FIG. 1c, output VF of source follower transistor M1 is coupled to second stage amplifier 206, as well as to guard pin of MEMS microphone 202 via pin 262 in order to reduce the effect microphone parasitic capacitance CP2. Since the voltage at the gate of transistor M1 is in phase with the voltage at the source of transistor M1, the electrical effect of capacitance CP2 is reduced.

Microphone gate bias generator 244 provides a bias voltage to the gate of M1. Here, the output of voltage source VG is filtered by transistor M7, which is biased in its linear region using current source IBG and resistance R1 to provide a gate-source voltages that produces an output resistance in the range of about 50 GΩ to about 250 GΩ.

During operation, of system 200, a mechanical shock may produce transient voltages at the output of MEMS microphone 202. These transient voltages may include negative transients that range, for example, between about −1 V and about −4 V, or a positive transients that range, for example, between about 1 V and about 4V. Transient voltages outside of these ranges may be possible depending on the particular system and the environment in which it operates. Both shock recovery circuit 246 and bias generator 244 may prevent the gate of M1 from experiencing high transient voltages in the presence of mechanical shock to MEMS microphone 202. During negative voltage excursions, diode D1 of shock recovery circuit 246 clamps the gate of M1 to about one diode drop or about 0.3 V below ground. During positive voltage excursions, the parasitic bulk diode of transistor M7 together with the transistor M7 in bias generator 244 limits the positive shock event.

Figure 2A:
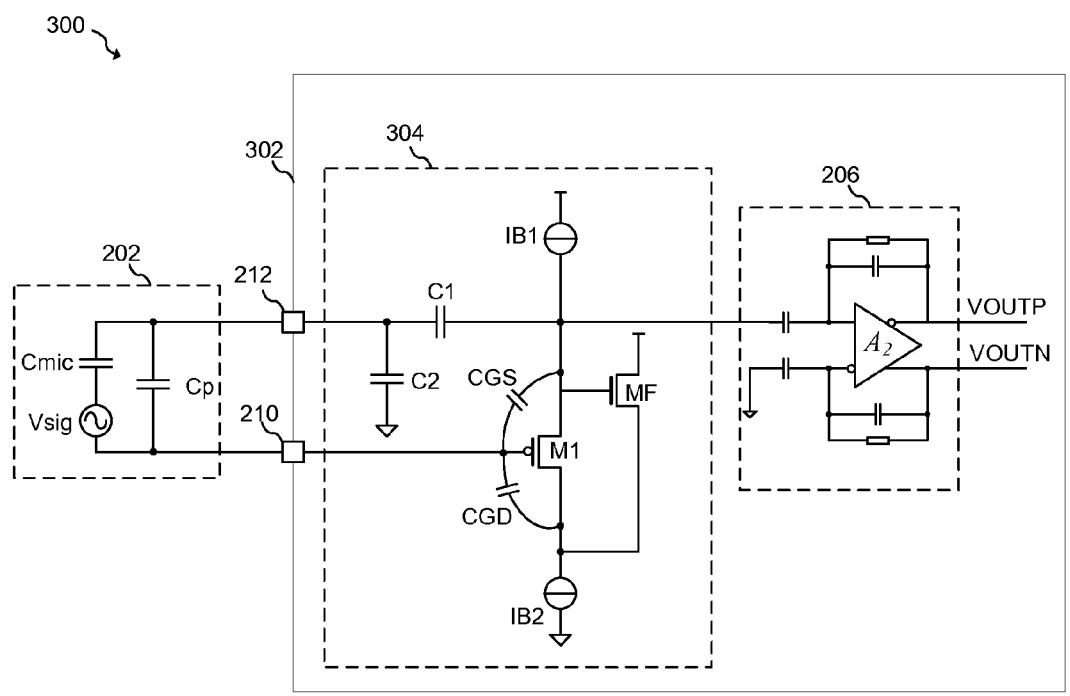
FIGS. 2a-b illustrate a capacitive signal source amplifier according to an embodiment of the present invention.

FIG. 2a illustrates amplification system 300 according to an embodiment of the present invention. Here, the effect of parasitic capacitance of CGD is reduced by using additional buffer transistor MF, which buffers the signal at the source of transistor M1 to the drain of transistor M1, thereby causing the drain voltage of transistor M1 to move in-phase with the gate voltage of transistor M1. Since the drain of transistor M1 moves in-phase with the gate of transistor M1, the effect of parasitic gate-drain capacitance CGD is significantly reduced and/or eliminated. By reducing and/or eliminating the effect of transistor CGD, larger transistor sizes may be used to implement transistor M1 without CGD causing degradation of the signal-to-noise ratio of the system. For example, in some embodiments, values of CGD between about 300 fF and about 1 pF may be used without significantly degrading system performance. Alternatively, values of CGD may be used outside of this range. Transistor M1 may be implemented using a PMOS transistor and transistor MF may be implemented using a NMOS transistor. In alternative embodiments, transistor M1 may be implemented using a PMOS transistor and transistor MF may be implemented using a NMOS transistor. Alternatively, other transistor types may also be used. For example, in one example, transistor MF may be implemented using a BJT emitter follower.

Figure 2B:
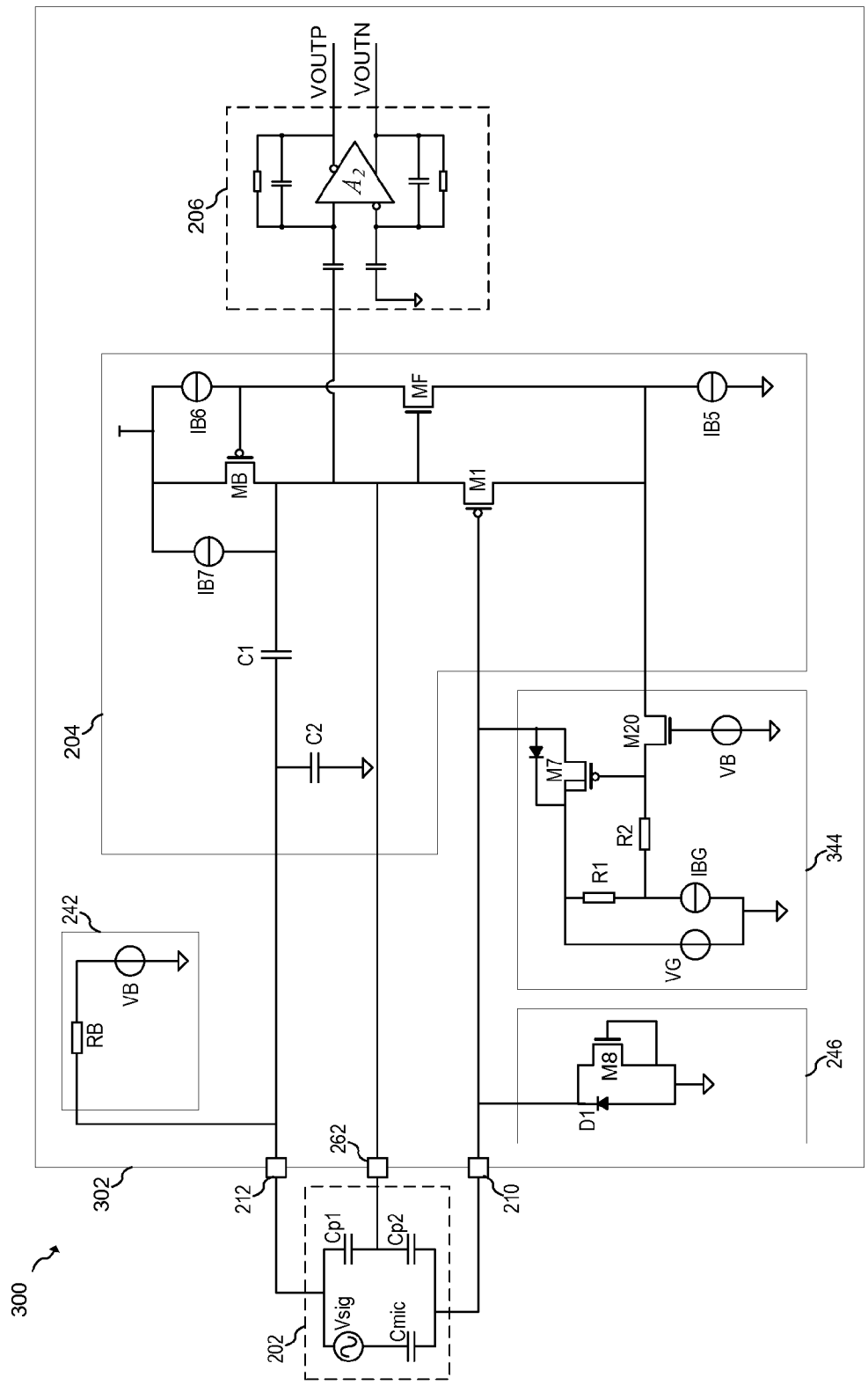

FIG. 2b illustrates a more detailed view of a circuit implementation of embodiment system 300, which includes integrated circuit 302 that is configured to be coupled to MEMS microphone 202 via pins 210, 212, and 262. Integrated circuit 302 includes gain boosted source follower stage 304 followed by single ended to differential amplifier 206. In alternative embodiments, other amplifier architectures, if any, may be used in place of single ended to differential amplifier 206, for example an instrumentation amplifier. In other embodiments, second state 206 may be omitted. In some embodiments, MEMS microphone 202 may also be included on integrated circuit 302. Differential outputs VOUTP and VOUTN may be coupled to output pins (not shown) or coupled to an input of an analog to digital converter (not shown) for further audio processing or to provide a digital output.

In an embodiment, C1 is between about 0.1 pF to about 10 pF, while C2 is between about 1 pF and about 11 pF, hence, the gain of stage 304 may be between about 1 and about 11. Such values may be used, for example, with MEMS microphones are capacitive sensors having a capacitance Cmic of between about 1 pF and about 2 pF. Alternatively, other component values and gain ranges may be realized and other sensor capacitances used outside of the above-mentioned ranges.

Gain boosted stage 304 has the gate of PMOS source follower transistor M1 coupled to pin 210. The gate of NMOS source follower transistor MF is coupled to the source of PMOS transistor M1, and the source of NMOS source follower transistor MF is coupled to the drain of PMOS transistor M1. As such, the drain voltage of source follower transistor M1 is in phase with the gate and source of source follower transistor M1. PMOS transistor M1 and NMOS transistor MF are biased in a feedback loop that adjusts the current through PMOS transistor MB such that the sum of currents through PMOS source follower transistor M1 and NMOS transistor MF have is approximately equal to the current being sourced by current source IB5. Current source IB6 provides drain current to NMOS transistor MF, and current source IB7 ensures that there is some current available at start-up. By using the illustrated feedback biasing configuration, the impedance seen at the source of source follower transistor MF can be kept very low. In alternative embodiments of the present invention, however, other biasing schemes may be used. For example, source follower transistor MF and/or source follower M1 may be biased in an open loop manner. In other embodiments, other bias networks known in the art may also be used. M1 may be biased in the subthreshold region in order to further reduce thermal and flicker noise.

Integrated circuit 302 also includes gate bias generator 344 that provides a bias voltage for the gate of source follower transistor M1, as well as circuitry that prevents a second stable operating point that may occur at startup or as a result of transients at the output of MEMS microphone 202, for example, transients caused by thermal shock. In some embodiments, NMOS transistor M20 may be coupled to the drain of source follower transistor M1 in order to pull up the drain voltage if the drain potential of source follower transistor M1 is too low. Such a condition may occur at startup. When the voltage at the drain of source follower transistor M1 is less than a threshold below voltage VB, transistor M20 conducts and begins to pull the drain potential of transistor M1 higher. During this time, the gate voltage of PMOS gate bias transistor M7 is also pulled lower due to current flowing through R2, thereby lowering the source-drain resistance of M7. This lowered source-drain resistance allows the gate of source follower transistor M1 to be pulled to gate bias voltage VG at a rate faster than would be achieved under quiescent conditions when the gate-source voltage being biased with a voltage that is the product of R1 and the current sourced by current source IBGV. In one embodiment, the value of R1 is between about 1 kΩ and about 10 kΩ, and the value of R2 is between about 700 kΩ and about 2 MΩ. Alternatively, component values outside of these ranged may be used. Under quiescent operating conditions transistor M7 provides a resistance greater than 1 GΩ. Alternatively, component values outside of these ranged may be used.

Shock recovery circuit 246 and block 344 further prevents the gate of M1 from experiencing high transient voltages in the presence of mechanical shock to MEMS microphone 202. During negative voltage excursions, diode D1 clamps the gate of M1 to about one diode drop or about 0.3 V below ground. During positive voltage excursions, the parasitic bulk diode of transistor M7 together with the transistor M7 in block 344 limits the positive shock event. MEMS microphone bias generator 242 is used to provide a bias voltage to MEMS microphone 202, and is shown modeled by voltage source VB in series with resistance RB, which has a resistance in the GΩ region. Resistance RB and capacitor C2 form a lowpass filter that filters noise coming from voltage source VB. Voltage source VB may be implemented using a charge pump as described in U.S. patent application Ser. No. 13/183,193.

Figure 3:
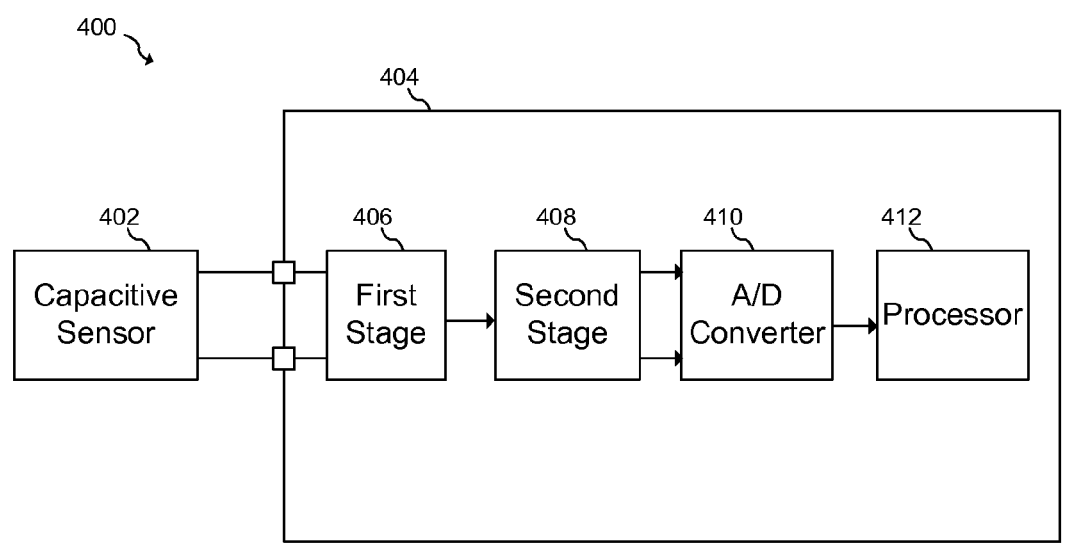
FIG. 3 illustrates a system according to an embodiment of the present invention.

FIG. 3 illustrates system 400 using embodiments of the present invention. Capacitive sensor 402 is coupled to integrated circuit 404 having first stage 406 and second stage 408. First state 406 may be implemented according to embodiments of the present invention described herein, and second stage may be implemented, for example, using circuits and methods described in U.S. patent application Ser. No. 13/183,193. In an embodiment, the differential output of second stage 408 is coupled to A/D converter 410.

In some embodiments, A/D converter is implemented as an audio sigma-delta converter. In other embodiments, A/D converter can be, for example, a low frequency A/D suitable for sensor applications. In embodiments, the output of A/D converter is coupled to processor 412 to perform a useful function. Examples of possible applications achievable by system 400 include, but are not limited to telephone systems, digital recorders, and remote sensing systems.

In some embodiments, for example, capacitive sensor 402 can be a MEMS microphone or other capacitive sensor such as capacitive pressure sensor, an ECM, or another type of floating capacitive signal source. In alternative embodiments, capacitive sensor 402 can be included on integrated circuit 404. Furthermore, A/D converter 410 and/or processor 412 can be located separately from integrated circuit 404. In some embodiments, the functionality of integrated circuit 404 may be implemented using a single integrated circuit, or using a plurality of integrated circuits.

In accordance with an embodiment, a system for amplifying a signal provided by a capacitive signal source includes a first voltage follower device, a second voltage follower device, and a first capacitor. The first voltage follower device includes an input terminal configured to be coupled to a first terminal of the capacitive signal source, and the second voltage follower device includes an input terminal coupled to the first output terminal of the first voltage follower device, and an output terminal coupled to a second output terminal of the first voltage follower device. Furthermore, first capacitor has a first end coupled to a first output terminal of the first voltage follower device, and a second end configured to be coupled to a second terminal of the capacitive signal source. The first voltage follower device may be implemented using a MOS source follower that may be biased in the sub-threshold region. Some embodiment systems have a further amplification stage coupled to the first output of the first voltage follower.

The system further includes a second capacitor having a first end coupled to a reference node and a second end configured to be coupled to the second terminal of the capacitive signal source. In some embodiments, the system includes the capacitive signal source that may be, for example, an MEMS microphone, a sensor, or another type of capacitive signal source.

In an embodiment, the first voltage follower device is implemented using a MOS device, the input terminal of the first voltage follower device is a gate terminal of the MOS device, the first output terminal of the first voltage follower device is a source terminal of the MOS device, and the second output terminal of the first voltage follower device is a drain terminal of the MOS device.

In accordance with a further embodiment, an amplifier for amplifying a signal provided by a high impedance signal source includes a source follower transistor having a gate configured to be coupled to a first terminal of the high impedance signal source, a first capacitor having a first terminal coupled to a source terminal of the source follower transistor and a second terminal configured to be coupled to a second terminal of the high impedance signal source, and a voltage follower device having an input terminal coupled to a first output terminal of the source follower transistor, and an output terminal coupled to a drain terminal of the source follower transistor. The source follower transistor may biased in the sub-threshold region.

The amplifier may further include a second capacitor having a first terminal coupled to a reference voltage node and a second terminal configured to be coupled to the second terminal of the high impedance signal source. In some embodiments, a voltage gain from the first and second terminals of the high impedance signal source to the source of the source follower transistor is dependent on a ratio of a capacitance of the first capacitor and a capacitance of the second capacitor. A voltage gain from the first and second terminals of the high impedance signal source to the source of the source follower transistor may be greater than one.

In an embodiment, the amplifier also includes a first bias transistor coupled between the gate of the source follower transistor and a gate reference voltage node. Furthermore, a second bias transistor may be coupled between the drain of the source follower transistor and a gate of the first bias transistor. The amplifier may further include a first resistor having a first terminal coupled to the gate of the first bias transistor and a second terminal coupled to a first current source, and a second resistor coupled between the second terminal of the first resistor and the gate reference voltage node.

In an embodiment, the source follower transistor includes a PMOS device, and the voltage follower device comprises a NMOS source follower transistor. The source follower transistor, voltage follower device, and the first capacitor may be disposed on an integrated circuit. The high impedance signal source may be a capacitive signal source, which may be implemented as a MEMS microphone.

In accordance with a further embodiment, a method of amplifying a signal provided by a capacitive signal source includes receiving a first signal from a first terminal of the capacitive signal source at a gate terminal of a first voltage follower device, receiving a second signal from a second terminal of the capacitive signal source at a first capacitor coupled to a source node of the first voltage follower device, amplifying the first and second signals, receiving a third signal from the source node of the first voltage follower device at a control terminal of a second voltage follower device, and applying a fourth signal at an output node of the second voltage follower device to a drain node of the first voltage follower device. Amplifying the first and second signals includes applying a voltage gain based on a ratio of the first capacitor and a second capacitor coupled between the second terminal of the capacitive signal source and a reference node.

Applying the fourth signal may reduce a parasitic gate-drain capacitance of the first voltage follower device. In some embodiments, the method further includes performing an analog to digital conversion on the third signal.

Advantages of embodiments include good noise performance, and less attenuation attributable to the gate-drain capacitance of an input source follower transistor. A further advantage includes the ability of using large source follower transistors in audio systems without degrading the gain and noise figure of the amplifier due to capacitive signal attenuation due to the parasitic source-drain capacitance of the input source follower transistor.

A further advantageous aspect of embodiments includes the ability to withstand input transients, for example transients caused by mechanical shock of the MEMS microphone.

A further advantage of embodiments includes a very low output impedance of the first stage. As such, for a single ended application, embodiment source follower circuits function as a good voltage source having a low output impedance. A high PSRR may be achieved in embodiments in which a second stage performs a single ended to differential conversion.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for amplifying a signal provided by a signal source, the system comprising:
   a first voltage follower device comprising an input terminal configured to be coupled to a first terminal of the signal source;
   a first capacitor comprising a first end coupled to a first output terminal of the first voltage follower device, and a second end configured to be coupled to a second terminal of the signal source; and
   a second voltage follower device comprising an input terminal coupled to the first output terminal of the first voltage follower device, and an output terminal coupled to a second output terminal of the first voltage follower device.

2. The system of claim 1, further comprising a second capacitor comprising a first end coupled to a reference node and a second end configured to be coupled to the second terminal of the signal source.

3. The system of claim 1, wherein the first voltage follower device comprises a MOS source follower.

4. The system of claim 3, wherein the MOS source follower is biased in a sub-threshold region.

5. The system of claim 1, further comprising the signal source.

6. The system of claim 5, wherein the signal source comprises a MEMS microphone.

7. The system of claim 1, further comprising an amplification stage coupled to the first output terminal of the first voltage follower device.

8. The system of claim 1, wherein:
   the first voltage follower device comprises a MOS device;
   the input terminal of the first voltage follower device comprises a gate terminal of the MOS device;
   the first output terminal of the first voltage follower device comprises a source terminal of the MOS device; and
   the second output terminal of the first voltage follower device comprises a drain terminal of the MOS device.

9. An amplifier for amplifying a signal provided by a signal source, the amplifier comprising:
   a source follower transistor having a gate configured to be coupled to a first terminal of the signal source;
   a first capacitor having a first terminal coupled to a source terminal of the source follower transistor and a second terminal configured to be coupled to a second terminal of the signal source; and
   a voltage follower device comprising an input terminal coupled to a first output terminal of the source follower transistor, and an output terminal coupled to a drain terminal of the source follower transistor.

10. The amplifier of claim 9, further comprising a second capacitor having a first terminal coupled to a reference voltage node and a second terminal configured to be coupled to the second terminal of the signal source.

11. The amplifier of claim 10, wherein a voltage gain from the first and second terminals of the signal source to the source terminal of the source follower transistor is dependent on a ratio of a capacitance of the first capacitor and a capacitance of the second capacitor.

12. The amplifier of claim 10, wherein a voltage gain from the first and second terminals of the signal source to the source terminal of the source follower transistor is greater than one.

13. The amplifier of claim 9, further comprising a first bias transistor coupled between the gate of the source follower transistor and a gate reference voltage node.

14. The amplifier of claim 13, further comprising a second bias transistor coupled between the drain terminal of the source follower transistor and a gate of the first bias transistor.

15. The amplifier of claim 14, further comprising:
   a first resistor having a first terminal coupled to the gate of the first bias transistor and a second terminal coupled to a first current source; and
   a second resistor coupled between the second terminal of the first resistor and the gate reference voltage node.

16. The amplifier of claim 9, wherein:
   the source follower transistor comprises a PMOS device; and
   the voltage follower device comprises a NMOS source follower transistor.

17. The amplifier of claim 9, wherein the source follower transistor, voltage follower device, and the first capacitor are disposed on an integrated circuit.

18. The amplifier of claim 9, wherein the source follower transistor is biased in a sub-threshold region.

19. The amplifier of claim 9, wherein the signal source comprises a capacitive signal source.

20. The amplifier of claim 19, wherein the capacitive signal source comprises a MEMS microphone.

21. A method of amplifying a signal provided by a signal source, the method comprising:
   receiving a first signal from a first terminal of the signal source at a gate terminal of a first voltage follower device;
   receiving a second signal from a second terminal of the signal source at a first capacitor coupled to a source node of the first voltage follower device;
   amplifying the first and second signals, amplifying comprising applying a voltage gain based on a ratio of the first capacitor and a second capacitor coupled between the second terminal of the signal source and a reference node;
   receiving a third signal from the source node of the first voltage follower device at a control terminal of a second voltage follower device; and
   applying a fourth signal at an output node of the second voltage follower device to a drain node of the first voltage follower device.

22. The method of claim 21, wherein applying the fourth signal reduces a parasitic gate-drain capacitance of the first voltage follower device.

23. The method of claim 21, further comprising performing an analog to digital conversion on the third signal.

* * * * *